(12) United States Patent
Yoshimura et al.

(10) Patent No.: US 10,503,432 B2
(45) Date of Patent: Dec. 10, 2019

(54) BUFFERING AND COMPRESSING DATA SETS

(71) Applicant: INTERNATIONAL BUSINESS MACHINES CORPORATION, Armonk, NY (US)

(72) Inventors: Takeshi Yoshimura, Sumida-ku (JP); Tatsuhiro Chiba, Koto-ku (JP)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 15/873,376

(22) Filed: Jan. 17, 2018

(65) Prior Publication Data

US 2019/0220223 A1    Jul. 18, 2019

(51) Int. Cl.
*G06F 3/06* (2006.01)
*G06F 13/16* (2006.01)
*H03M 7/30* (2006.01)

(52) U.S. Cl.
CPC ........ *G06F 3/0656* (2013.01); *G06F 13/1673* (2013.01); *H03M 7/30* (2013.01)

(58) Field of Classification Search
CPC ........... G06F 7/00; G06F 12/00; G06Q 99/00; H04B 3/36
USPC ....................................................... 710/52
See application file for complete search history.

(56) References Cited

U.S. PATENT DOCUMENTS

| | | | |
|---|---|---|---|
| 2004/0015904 A1* | 1/2004 | Jourdan | G06F 9/3838 717/141 |
| 2005/0223118 A1* | 10/2005 | Tucker | G06F 12/1081 709/250 |
| 2005/0246502 A1* | 11/2005 | Joshi | G06F 12/1441 711/147 |
| 2005/0278388 A1* | 12/2005 | Butterworth | G06F 11/08 |
| 2006/0010002 A1* | 1/2006 | Kunde | G07B 17/00362 711/173 |
| 2008/0172525 A1* | 7/2008 | Nakamura | G06F 3/0608 711/113 |
| 2013/0063288 A1 | 3/2013 | Bley | |
| 2015/0127994 A1 | 5/2015 | Sankar et al. | |
| 2015/0254155 A1 | 9/2015 | Agarwala et al. | |

\* cited by examiner

*Primary Examiner* — Getente A Yimer
(74) *Attorney, Agent, or Firm* — Tutunjian & Bitetto, P.C.; Vazken Alexanian

(57) ABSTRACT

A method, computer program product, and apparatus for buffering data sets are provided. The method includes preparing at least one buffer including a plurality of compression windows. The method also includes receiving a data set. The method further includes writing the received data set into a data region in a first compression window among the plurality of compression windows included in a first buffer among the at least one buffer. The method also includes updating statistics of a statistics region in the first compression window based on the received data set. The method further includes compressing the data set from the data region of the first compression window based on the statistics in the statistics region of the first compression window. The method also includes sending the compressed data set to the data region of the first compression window to replace the received data set.

20 Claims, 5 Drawing Sheets

BUFFERING AND COMPRESSING DATA SETS

BACKGROUND

Technical Field

The present invention relates to buffering and compressing data sets. More specifically, the present invention relates to buffering and compressing large data sets efficiently.

Description of the Related Art

Data buffering is adopted for transferring data from a sender to a receiver in a variety of systems, such as computer systems, I/O systems, storage systems and network systems. A large data buffer is required when the peak data throughput of a sender is higher than the peak data throughput of a receiver even though the average data throughputs of the sender may not be more than the peak data throughput of the receiver. It is also effective to compress data at a data buffering system and forward the compressed data from the data buffering system to the receiver so as to substantially increase the peak data throughput of the receiver.

One example of such a data buffering system, ftrace is used for tracing kernel events in the LINUX® operating system and outputting a log in a storage. Other examples are data streaming or message processing systems, such as Spark and Kafka. However, existing data buffering systems are not suitable for handling large data sets frequently received from a sender due to non-negligible overheads, such as CPU, memory, or I/O overhead.

SUMMARY

According to an embodiment of the present invention, provided is a computer-implemented method including preparing at least one buffer including a plurality of compression windows, each compression window having a data region for storing data and a statistics region for storing statistics of data stored in the data region, receiving a data set, writing the received data set into the data region in a first compression window among a plurality of compression windows included a first buffer among the at least one buffer, updating statistics of the statistics region in the first compression window based on the received data set, compressing the data set in the data region of the first compression window based on the statistics in the statistics region of the first compression window, and sending the compressed data set in the data region of the first compression window.

Related embodiments may also include a computer program product including one or more computer readable storage mediums collectively storing program instructions that are executable by a computer to cause the computer to perform the method, and a buffering apparatus that performs the method.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Hereinafter, example embodiments of the present invention will be described. The example embodiments shall not limit the invention according to the claims, and the combinations of the features described in the embodiments are not necessarily essential to the invention.

Figure 1:
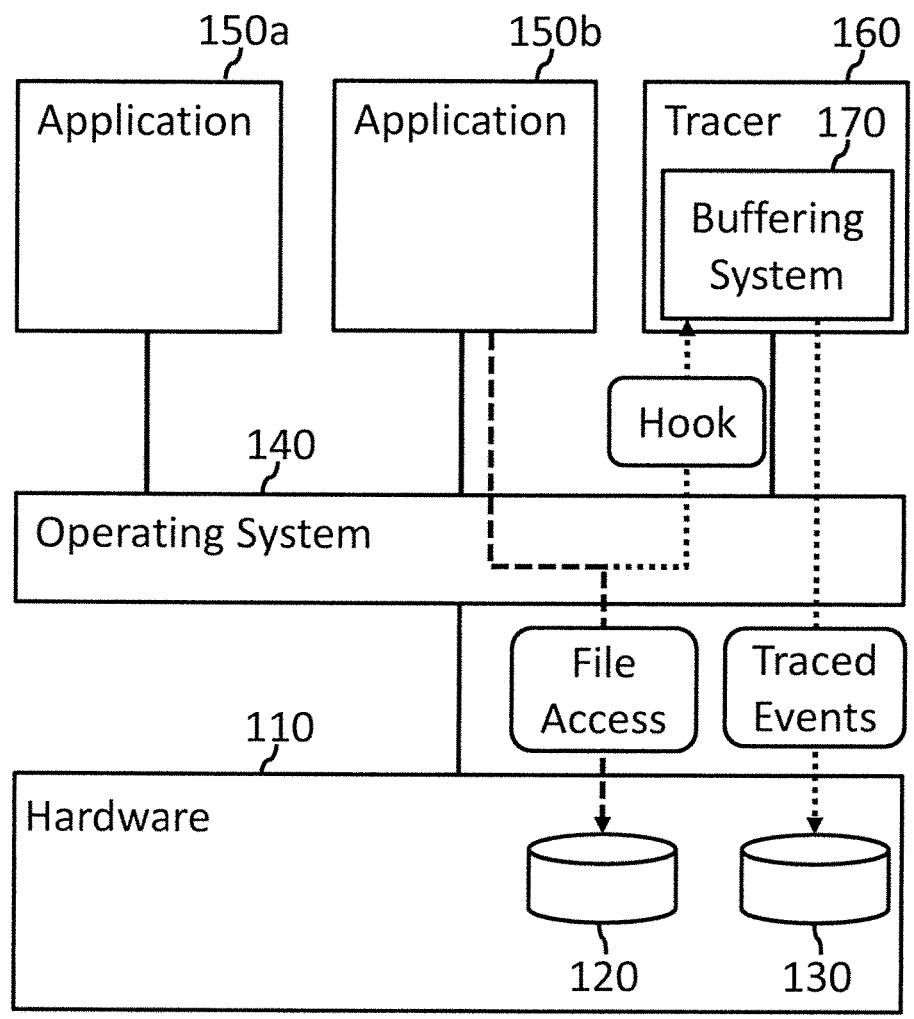
FIG. 1 shows an apparatus according to an embodiment of the present invention.

FIG. 1 shows an apparatus 100 according to an embodiment of the present invention. Apparatus 100 may be a computer, such as a personal computer or a client computer, such as a desktop computer, a portable computer, a tablet computer, or a smartphone. Apparatus 100 may also be a server computer or a host computer, such as a business server, an engineering server, or a mainframe computer. Apparatus 100 includes a buffering system 170 for buffering and compressing large data sets. In this embodiment, the buffering system 170 may be used for buffering and compressing events such as storage access events, and storing the compressed events to storage 130 as a trace log.

Apparatus 100 includes hardware 110, operating system 140, one or more applications 150a, 150b (collectively or individually referred to as "application(s) 150"), and tracer 160. Hardware 110 may include at least one processor or programmable circuitry and one or more computer readable mediums collectively including instructions that, when executed by the processor or the programmable circuitry, cause the processor to perform operations or functions of operating system 140, applications 150a, 150b, and tracer 160.

Hardware 110 may also include storage 120 and storage 130. Storage 120 and storage 130 may be I/O devices or external storage devices such as a hard disk. Alternatively, storage 120 and storage 130 may be a compact disc, a digital versatile disk, or a non-volatile memory such as flash memory. Storage 120 and storage 130 may be different storages or different storage areas of the same storage. Storage 120 may store files used in apparatus 100. Storage 130 may store events traced in apparatus 100. Storage 130 may store events in one or more files.

Operating system 140 is executed on hardware 110. Operating system 140 may provide APIs (Application Program Interfaces), libraries, drivers, and/or system calls for enabling applications 150a, 150b to use functions of hardware 110 and operating system 140. Operating system 140 may access storage 120 based on storage access requests from applications 150a, 150b. Operating system 140 may also support accessing storage 130 based on storage access requests from tracer 160.

One or more applications 150a, 150b may be executed on operating system 140. Applications 150a, 150b may use APIs, libraries, driers, and/or system calls of operating system 140. In this embodiment, applications 150a, 150b may use a database in storage 120 and the performance of applications 150a, 150b may mainly be governed by a storage access throughput of accessing storage 120.

Tracer 160 may trace events that occur in apparatus 100. In this embodiment, tracer 160 may insert a hook in the file access API of operating system 140 and thereby may receive a subroutine call, jump, message, or interrupt when the file access API is used by applications 150*a*, 150*b*. By using this hook, tracer 160 traces storage accesses or file accesses to storage 120 from applications 150*a*, 150*b* (e.g. file write, file read, file create, and/or file delete) as traced events. Each traced event may include at least one of name and/or identifier of the application that requested a storage access, a type of storage access (e.g. read, write, create, and/or delete), name and/or an identifier of the accessed file, accessed location of the file, and accessed data length.

Tracer 160 includes buffering system 170. Buffering system 170 buffers traced events and sends the traced events to storage 130 as write data to be stored in storage 130. Buffering system 170 may receive traced events at irregular timings depending on the execution of applications 150*a*, 150*b*. Buffering system 170 may receive traced events extremely frequently at the theoretical peak throughput of operating system 140. Since the write throughput of storage 130 is limited, buffering system 170 buffers these traced events temporarily received at extremely high throughput until storage 130 absorbs these traced events. Buffering system 170 may also compress traced events so as to reduce the size of the storage area required to store traced events and decrease the throughput required to transfer and write traced events. Traced events in storage 130 may be analyzed and utilized to improve the performance of at least one of applications 150*a*, 150*b*, operating system 140, and hardware 110.

In this embodiment, buffering system 170 is implemented as a program or software running on hardware 110 and operating system 140. In other implementations, buffering system 170 may be included in operating system 140, or implemented as hardware logic included in hardware 110. Buffering system 170 may be used for buffering other data such as data received from a network, data to be transmitted to a network, data between application 150 and storage 120, data between threads or processes in operating system 140 or application 150.

Figure 2:
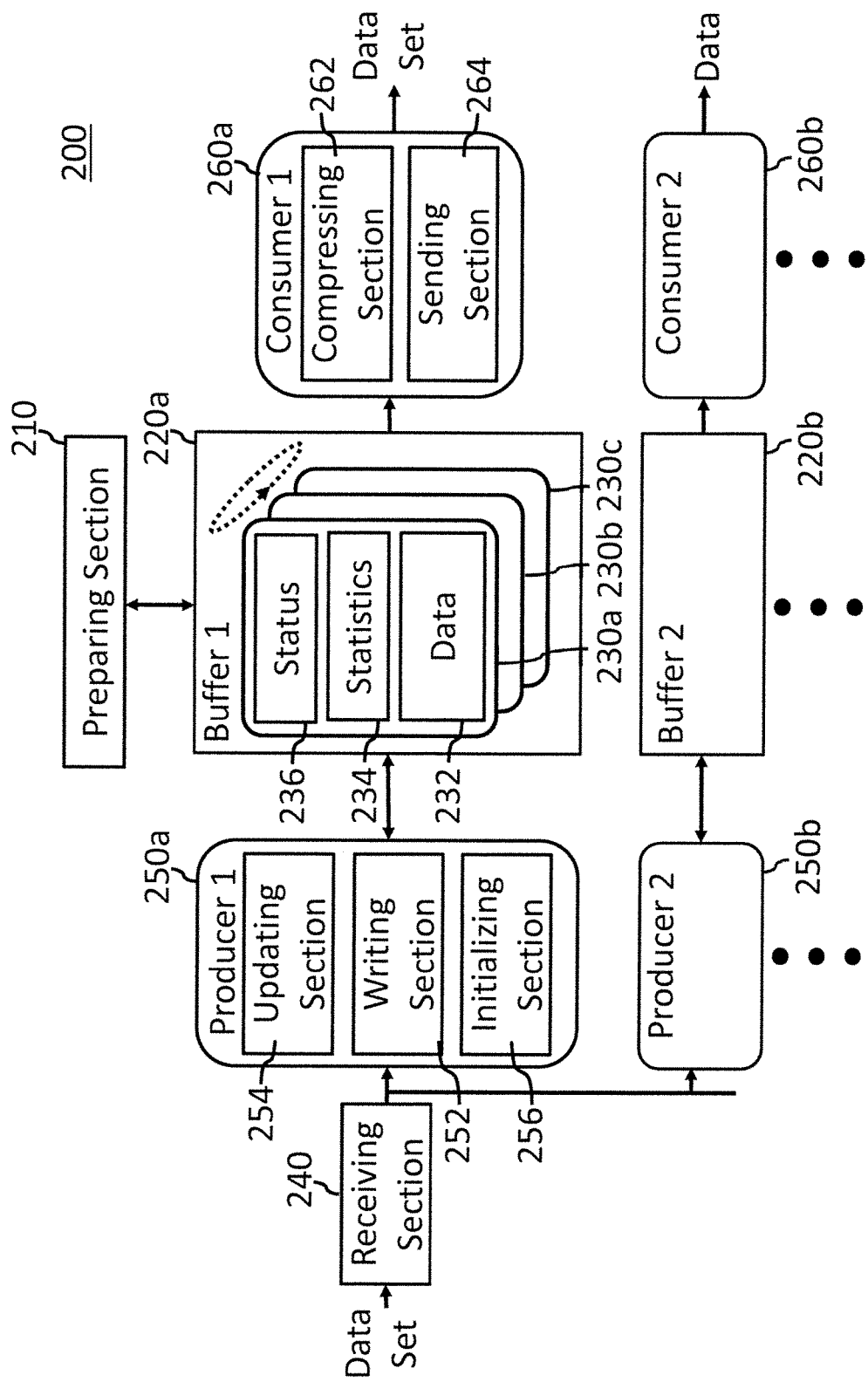
FIG. 2 shows a buffering apparatus according to an embodiment of the present invention.

FIG. 2 shows buffering apparatus 200 according to an embodiment of the present invention. Buffering apparatus 200 may buffer a data set. The data set is, for example, received in response to a monitored event in a computer system such as apparatus 100 in FIG. 1. Buffering apparatus 200 is substantially similar to buffering system 170 when executed on hardware 110 in FIG. 1. Alternatively, buffering apparatus 200 can be implemented as hardware such as electronic circuitry. Buffering apparatus 200 includes preparing section 210, one or more buffers 220*a*, 220*b* (collectively or individually referred to as "buffer(s) 220"), receiving section 240, one or more producers 250*a*, 250*b* (collectively or individually referred to as "producer(s) 250"), and one or more consumers 260*a*, 260*b* (collectively or individually referred to as "consumer(s) 260").

Preparing section 210 prepares at least one buffer 220*a*, 220*b*. Preparing section 210 prepares and initializes buffers 220*a*, 220*b* in response to, for example, launching or initialization of buffering apparatus 200.

Each buffer 220 among one or more buffers 220*a*, 220*b* includes a plurality of compression windows 230*a*, 230*b*, 230*c* (collectively or individually referred to as "compression window(s) 230"). Each compression window 230 is used for buffering a predetermined size of data (e.g. 4 KB, 64 KB, or page size). Data having a size larger than the capacity of one compression window is buffered in two or more consecutive compression windows 230.

In this embodiment, each buffer 220 is a ring buffer configured to use the plurality of compression windows 230 in FIFO order. In more detail, buffer 220 has a ring structure of compression windows 230, and if a given compression window 230 (e.g. 230*b*) becomes full, a subsequent compression window 230 (e.g. 230*c*) is used for storing subsequent data. Compression windows 230 are used cyclically, such that if the last compression window 230 (e.g. 230*c*) becomes full, then a first compression window 230 (e.g. 230*a*) is reused for storing subsequent data. In other implementations, buffer 220 may have another data structure. For example, buffering apparatus 200 may manage a list of vacant compression windows 230 and allocate a compression window 230 for subsequent data from one of the vacant compression windows 230 in the list.

Each compression window 230 includes data region 232 and statistics region 234. Data region 232 is for storing data and has a predetermined size for storing data received by buffering apparatus 200. Statistics region 234 is for storing statistics of data stored in the data region 232. For example, statistics region 234 stores the statistics of codes in data region 232, and the statistics are used for compressing data stored in data region 232 by consumer 260. In some implementation, each compression window 230 may also include status region 236. Status region 236 is for storing a status of each compression window 230.

Receiving section 240 receives a data set. For example, in a case where buffering apparatus 200 is used as buffering system 170 in FIG. 1, receiving section 240 may have an entry point that receives one or more traced events. Receiving section 240 transfers the received data set to one or more producers 250*a*, 250*b*. In this embodiment, the data set may include a plurality of data segments. Receiving section 240 may split the data set into the plurality of data segments, and distribute the plurality of data segments to a plurality of producers 250*a*, 250*b* so that the plurality of data segments are distributed to a plurality of buffers 220*a*, 220*b*. For example, receiving section 240 may receive a traced event and transfer an application identifier to buffer 1 (buffer 220*a*), a type of storage access to buffer 2 (buffer 220*b*), an identifier of the accessed file to buffer 3, and so on. By distributing data segments to a plurality of buffers 220, each buffer 220 may store one or more data segments. Since each data segment may tend to either keep the same value between data sets or traced events or limit the variation of values of each data segment, a compression ratio of data in each buffer 220 is expected to be higher than a compression ratio of data when all data segments are buffered in the same buffer 220.

One or more producers 250*a*, 250*b* produce data to be stored in buffers 220*a*, 220*b*. In this embodiment, "produce" means providing data to be queued in buffers 220*a*, 220*b*. In this embodiment, each producer 250 is assigned to each buffer 220, and each producer 250 stores one or more data segments in corresponding buffer 220 assigned to the producer 250. In other embodiments, buffering apparatus 200 may include one or more producers 250 each of which can store data in any one or several buffers 220.

Each producer 250 includes writing section 252 and updating section 254. Writing section 252 writes the received data set into the data region in a current compression window 230 (a current compression window 230 of the producer 250, for example, compression window 230*b*) among a plurality of compression windows 230 included in a buffer 220 among the at least one buffer 220*a*, 220*b*. In this embodiment, writing section 252 of each producer 250 writes each data segment of the received data set into a corresponding buffer 220 among the plurality of buffers 220a, 220b.

Updating section 254 updates statistics of the statistics region 234 in current compression window 230b based on the received data set. In this embodiment, updating section 254 of each producer 250 updates the statistics of statistics region 234 in current compression window 230b of corresponding buffer 220 based on the data segment assigned to corresponding buffer 220.

In some implementations, each producer 250 may include initializing section 256. Initializing section 256 may initialize the statistics in statistics region 234 of current compression window 230b based on the statistics in statistics region 234 of a compression window 230a which is previous to current compression window 230b before buffering data in current compression window 230b. By including initializing section 256, buffering apparatus 200 may utilize the statistics in one or more previous compression windows 230 when compressing data in current compression window 230b, and thus buffering apparatus 200 can calculate more precise statistics than statistics based only on the data in current compression window 230b.

One or more consumers 260a, 260b may consume data stored in buffers 220a, 220b. In this embodiment, "consume" means dequeueing data from buffers 220a, 220b and forwarding the data to a destination, such as an I/O device or a storage, such as storage 130. In this embodiment, each consumer 260 is assigned to a corresponding buffer 220, and each consumer 260 reads one or more data segments in the corresponding buffer 220. In other embodiments, buffering apparatus 200 may include one or more consumers 260 each of which can read data from any one or several buffers 220. In this embodiment, consumers 260 can independently and/or asynchronously compress data stored in buffers 220 and send the compressed data to destinations.

Each consumer 260 includes compressing section 262 and sending section 264. Compressing section 262 compresses the data set in data region 232 of current compression window 230 (current compression window 230 of consumer 260, for example, compression window 230a) based on the statistics in statistics region 234 of current compression window 230a. In this embodiment, compressing section 262 of each consumer 260 compresses each data segment based on the statistics of statistics region 234 of compression window 230a of corresponding buffer 220.

Sending section 264 sends the compressed data set in the data region 236 of the current compression window 230a to a destination such as storage 130 in FIG. 1 as an example. Sending section 264 may also send the statistics or information based on the statistics in statistics region 234 if it is necessary to use them when decompressing the compressed data set.

In this embodiment, buffering apparatus 200 uses a ring of the plurality of compression windows 230, each of which includes a data region 232 and statistics region 234 to buffer data frequently received from a data source. Therefore, buffering apparatus 200 can effectively reuse compression windows 230 and effectively compress data buffered in each compression window 230. By updating statistics region 234 in response to receiving a data set, compressing section 262 does not have to scan data region 232 when compressing data in data region 232.

In some implementations, updating section 254 can update statistics region 234 based on the received data set without referring the data set written in data region 232 in current compression window 230b. More specifically, producer 250 can temporarily hold the received data set in a temporal storage, such as one or more registers of a processor in hardware 110 in FIG. 1 or any other memory that can be accessed faster than reading data region 232. Writing section 252 can write the data set from this temporal storage. In response, updating section 254 can read statistics relating to the data value stored in statistics region 234 and update the statistics relating to the data value by using the data value in the temporal storage. In this fashion, updating section 254 does not have to refer to the data set in data region 232 that is written by writing section 252.

In some implementations, buffering apparatus 200 may be implemented on a computer system including a plurality of processors, processor cores, or hardware threads (collectively referred to as "processors"), and in which two or more processors independently send data sets to buffering apparatus 200. In these implementations, each buffer 220 (or two or more buffers 220) of the plurality of buffers 220 is assigned to a corresponding processor. Receiving section 240 may receive an event data segment from each processor among a plurality of processors in the computer system. In response, writing section 252 may write each event data segment into corresponding buffer 220 among the plurality of buffers 220. By using different buffers 220 for each processor, each producer 250, buffer 220, and consumer 260 can be executed on the corresponding processor. In this case, receiving section 240 may also be executed on the corresponding processor.

Figure 3:
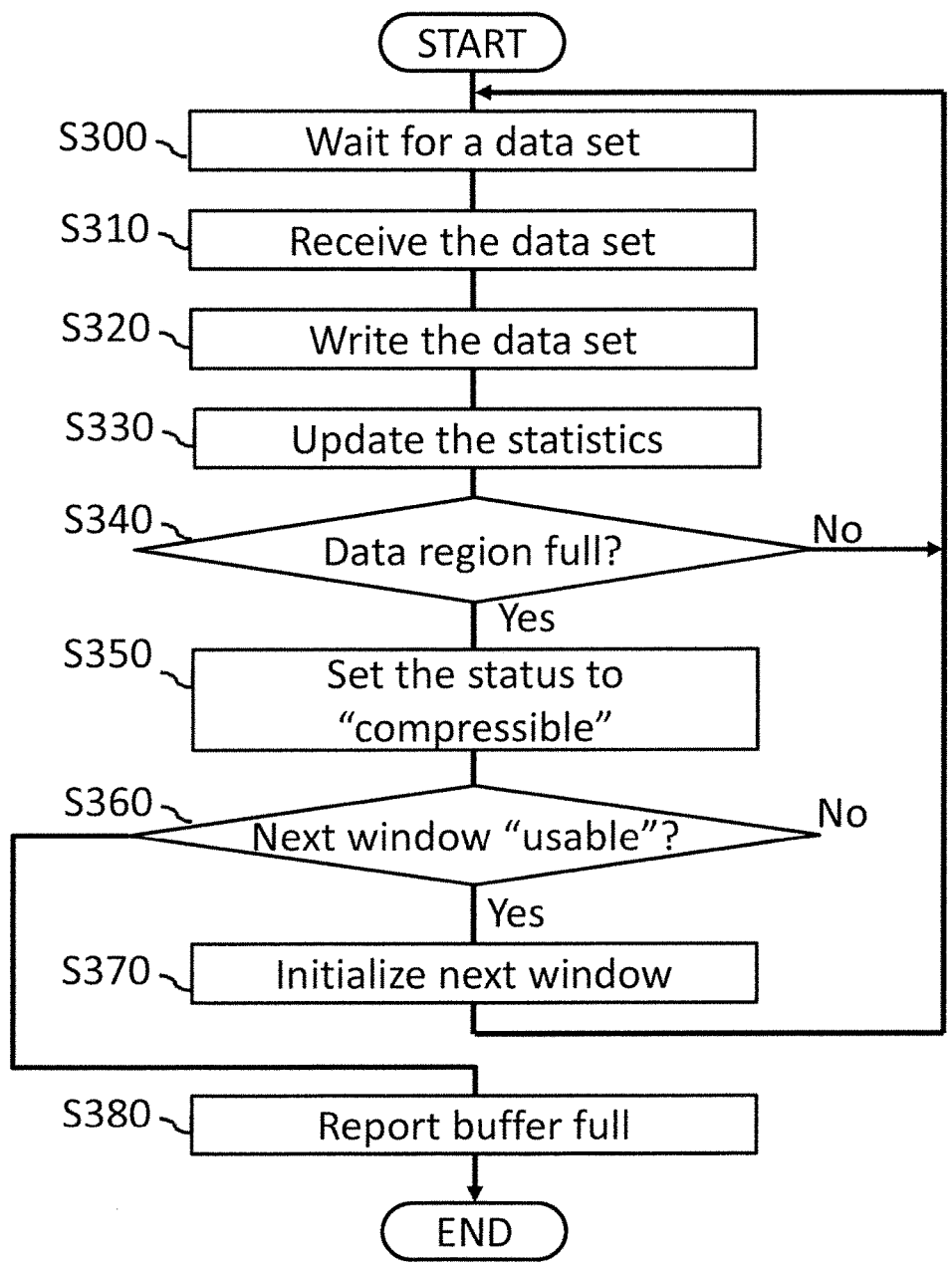
FIG. 3 shows an operational flow of a producer side according to an embodiment of the present invention.

FIG. 3 shows an operational flow of a producer side according to an embodiment of the present invention. The operations of FIG. 3 can be performed by, for example, receiving section 240 and producer 250 including their respective components explained in reference to FIG. 2. While the operational flow of FIG. 3 will be explained in reference to receiving section 240 and producer 250 and their respective components, the operational flow can be performed by other receiving sections and producers having different components as well.

At S300 (Step 300), receiving section 240 waits for a new data set. At S310, receiving section 240 receives a new data set. Receiving section 240 may split the received data set into a plurality of data segments, and distribute the plurality of data segments to a plurality of producers 250a, 250b.

At S320, writing section 252 in each producer 250 that received one or more data segments writes the received data segment of the received data set into corresponding buffer 220. Writing section 252 may manage a pointer to current compression window 230 (e.g. 230b) in buffer 220 and a pointer to the next data address for writing data in data region 232. Writing section 252 may write the data segment at the next data address in current compression window 230b and increment the next data address. Alternatively, buffer 220 may record these pointers and producer 250 may refer these pointers to identify current compression window 230 and the next data address.

At S330, updating section 254 in each producer 250 that receives one or more data segments updates statistics of statistics region 234 in current compression window 230b of corresponding buffer 220 based on the received data segment. Buffering apparatus 200 may adopt a compression algorithm, such as entropy coding (e.g. Huffman coding), run-length coding, or any other compression algorithm using the statistics of data. Updating section 254 updates the statistics of statistics region 234 in the way required by the compression algorithm used in buffering apparatus 200. If Huffman coding is adopted, then updating section 254 counts the number of occurrences of each data value (symbol). For example, if the data value of the received data segment is X'6A (hexadecimal byte of 6A), then updating section 254 increments the count of X'6A in statistics region 234. In FIG. 3, S330 follows S320, but S320 and S330 can be executed in opposite order or in parallel.

At S340, writing section 252 checks whether data region 232 of current compression window 230b of corresponding buffer 220 is full. Writing section 252 may compare the next data address with the last address of data region 232, and determine that current compression window 230b becomes full in case that the next data address exceeds the last address of data region 232. In other implementations, writing section 252 may determine that current compression window 230b becomes full in response to a condition that the amount of data stored in data region 232 exceeds a predetermined high water mark, which can be equal to or less than the size of data region 232. If data region 232 is not full at S340 (No at S340), then the operational flow proceeds to S300.

If data region 232 of current compression window 230b is full (Yes at S340), then the operational flow proceeds to S350. At S350, writing section 252 sets the status of current compression window 230b to "compressible," in response to filling data region 232 of compression window 230b. In this application, the status "usable" corresponds to any type of representation that enables consumer 260 to start compressing data in corresponding compression window 230.

At S360, writing section 252 moves to a next compression window 230c of current compression window 230b by, for example, changing the pointer from current compression window 230b to point to next compression window 230c. In response to the status of next compression window 230c (new current compression window 230c) not being "usable," (No at S360), the operation flow proceeds to S380. In this application, the status "usable" corresponds to any type of representation indicating that corresponding compression window 230 is available to be used by producer 250. At S380, producer 250 may report "buffer full" to tracer 160 in FIG. 1, operating system 140, or a user of buffering apparatus 200 or apparatus 100. Buffering apparatus 200 may ignore data sets received when buffer 220 is full. Instead of this, buffering apparatus 200 may allocate additional memory space, add one or more compression windows 230 to buffer 220 by using this additional memory space, and proceed to S300. By this operational flow, writing section 252 can write remaining data of the received data set into data region 232 in next compression window 230c (new current compression window 230c at S360), which is located next to current compression window 230b in response to filling data region 232 of current compression window 230b.

In response to the status of next compression window 230c being "usable" (Yes at S360), producer 250 moves the pointer to next compression window 230c and initializing section 256 may initialize the statistics in statistics region 234 of current compression window 230c (next compression window 230c before S360) based on statistics in statistics region 234 of a compression window 230b previous to current compression window 230c (current compression window 230b before S360). For example, initializing section 256 may copy the statistics in previous compression window 230b to statistics region 234 of current compression window 230c so as to accumulate the number of occurrence of each data value through two or more compression windows 230. Alternatively, initializing section 256 may decay the number of occurrence of each data value by, for example, multiplying a decay rate less than 1.0 so as to reflect current statistics more than the statistics in the past.

Figure 4:
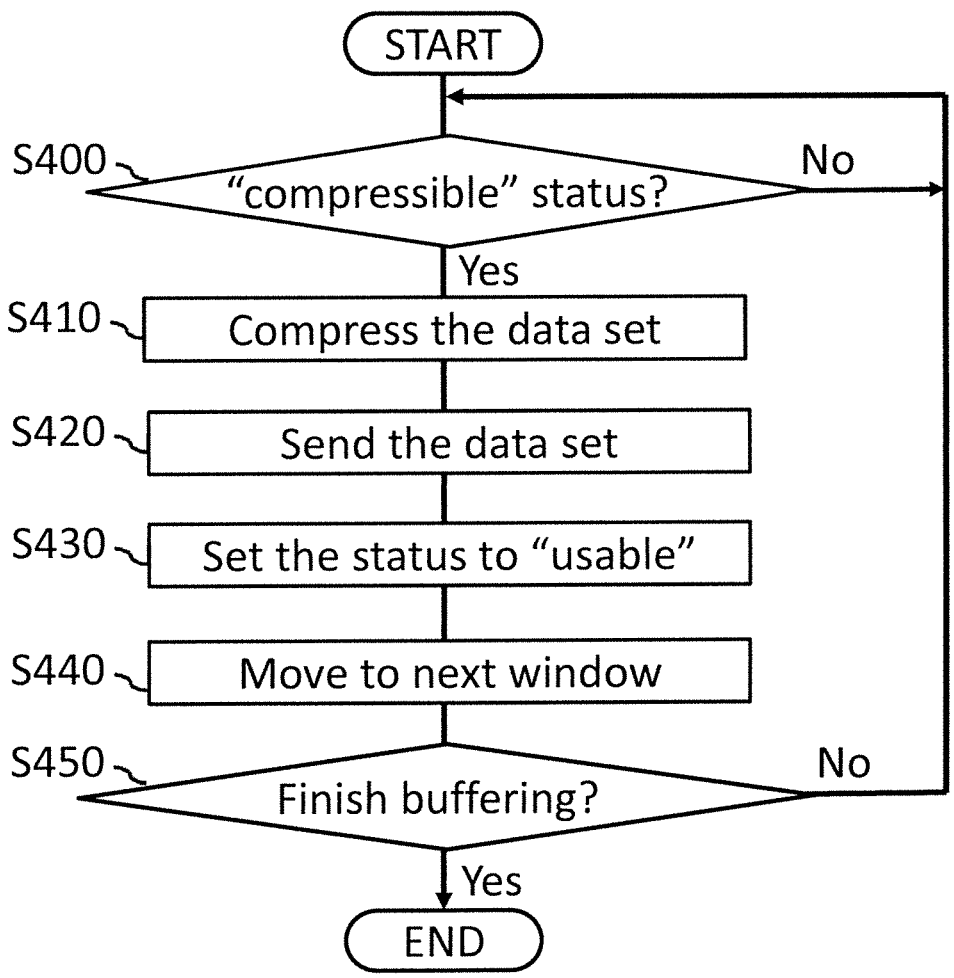
FIG. 4 shows an operational flow of a consumer side according to an embodiment of the present invention.

FIG. 4 shows an operational flow of a consumer side according to an embodiment of the present invention. The operations of FIG. 4 can be performed by, for example, consumer 260 including its components explained in reference to FIG. 2. While the operational flow of FIG. 4 will be explained in reference to consumer 260 and its components, the operational flow can be performed by other consumers having different components as well.

At S400, consumer 260 waits until the status of current compression window 230 (e.g. 230a) of consumer 260 becomes "compressible" (No at S400). Compressing section 262 may manage a pointer to current compression window 230a in buffer 220. Alternatively, buffer 220 may record this pointer and consumer 260 may refer this pointer to identify current compression window 230a for consumer 260.

In response to setting the status of current compression window 230a to "compressible" by producer 250 (Yes at S400), compressing section 262 compresses the data set in data region 232 of current compression window 230a at S410. Compressing section 262 reads the statistics in statistics region 234 and generates parameters for compressing data in data region 232. If Huffman coding is adopted, these parameters may include a code for each data value. For example, if a code of binary "00" is assigned to data value X'00, and a code of binary "01001" is assigned to data value X'01, parameters that represent the mapping between each data value and a code are generated.

Based on these parameters, compressing section 262 compresses data set in data region 232. If Huffman coding is adopted, compressing section 262 converts each data values in data region 232 to corresponding code. For example, X'00 in data region 232 is converted to "00" and X'01 in data region 232 is converted to "01001." Compressing section 262 may forward the compressed data set to sending section 264 without storing the compressed data set into compression window 230. In other implementations, compressing section 262 may store the compressed data set into compression window 230.

At S420, sending section 264 sends the compressed data set in data region 236 of current compression window 230a to a destination. Sending section 264 may also send the statistics or information based on the statistics in statistics region 234 if it is necessary to use them when decompressing the compressed data set. The information based on the statistics may depend on the compression algorithm of buffer apparatus 200. For example, the information based on the statistics may be a symbol table including an encoded code or value of at least one data values (symbols) in the received data set. Sending sections 264, each of which corresponds to a buffer 220, may send the compressed data segments (and the statistics or the information based on the statistics if it is necessary depending on the compression algorithm) as individual files to one or more storage devices such as storage 130 in FIG. 1. By storing compressed data segments from different buffers 220 to different files and/or different storage devices, consumers 260a, 260b do not need to synchronize the execution and total throughput of storing data in storage 130 can be improved. Sending sections 264 of each consumer 260 may assign a file name that includes a processor number or a processor identifier for the file storing the data from buffer 220 assigned to the corresponding processor. Sending sections 264 of each consumer 260 may also assign a file name that includes a data segment name or identifier for the file storing the corresponding data segment from buffer 220.

At S430, sending section 264 may set the status of current compression window 230a to "usable" in response to sending the compressed data set. By setting the status to "usable," producer 250 can release current compression window 320 and make it available to store new data set.

At S440, sending section 264 moves the pointer from current compression window 230a to indicate next compression window 230b.

At S450, consumer 260 checks whether the buffering is finished. For example, consumer 260 determines finishing buffering in response to terminating execution of tracer 160. If the buffering is not finished (No at S450), the operational flow proceeds to S400. If the buffering is finished (Yes at S450), the operational flow is ended.

Figure 5:
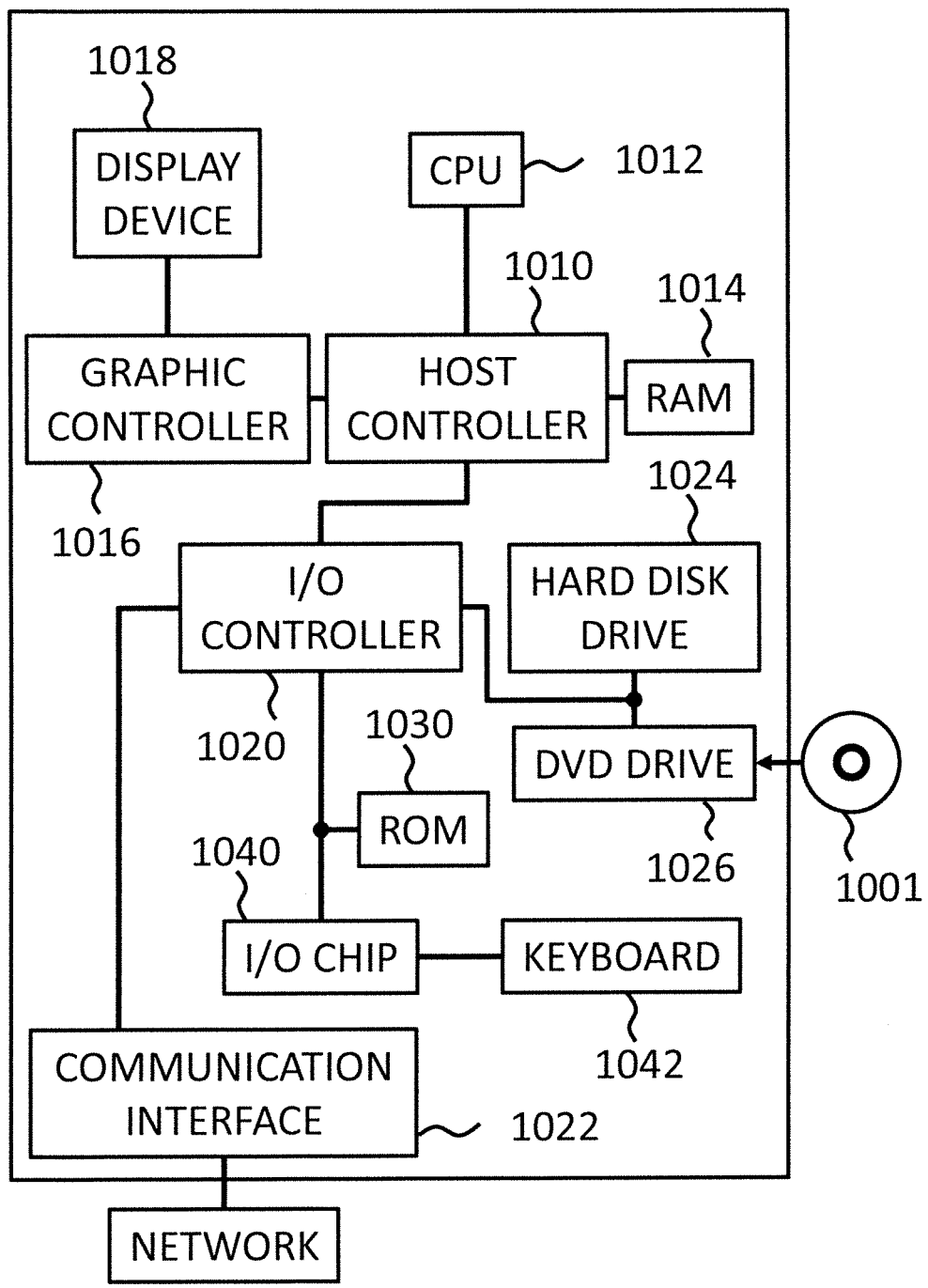
FIG. 5 shows an exemplary hardware configuration of a computer configured for executing a source program, according to an embodiment of the present invention.

FIG. 5 shows an exemplary hardware configuration of a computer configured for executing a source program, according to an embodiment of the present invention. A program that is installed in the computer 1000 can cause the computer 1000 to function as or perform operations associated with apparatuses of the embodiments of the present invention or one or more sections (including modules, components, elements, etc.) thereof, and/or cause the computer 1000 to perform processes of the embodiments of the present invention or steps thereof. Such a program may be executed by the CPU 1012 to cause the computer 1000 to perform certain operations associated with some or all of the blocks of flowcharts and block diagrams described herein.

The computer 1000 according to the present embodiment includes a CPU 1012, a RAM 1014, a graphics controller 1016, and a display device 1018, which are mutually connected by a host controller 1010. The computer 1000 also includes input/output units such as a communication interface 1022, a hard disk drive 1024, a DVD-ROM drive 1026 and an IC card drive, which are connected to the host controller 1010 via an input/output controller 1020. The computer also includes legacy input/output units such as a ROM 1030 and a keyboard 1042, which are connected to the input/output controller 1020 through an input/output chip 1040.

The CPU 1012 operates according to programs stored in the ROM 1030 and the RAM 1014, thereby controlling each unit. The graphics controller 1016 obtains image data generated by the CPU 1012 on a frame buffer or the like provided in the RAM 1014 or in itself, and causes the image data to be displayed on the display device 1018.

The communication interface 1022 communicates with other electronic devices via a network 1050. The hard disk drive 1024 stores programs and data used by the CPU 1012 within the computer 1000. The DVD-ROM drive 1026 reads the programs or the data from the DVD-ROM 1001, and provides the hard disk drive 1024 with the programs or the data via the RAM 1014. The IC card drive reads programs and data from an IC card, and/or writes programs and data into the IC card.

The ROM 1030 stores therein a boot program or the like executed by the computer 1000 at the time of activation, and/or a program depending on the hardware of the computer 1000. The input/output chip 1040 may also connect various input/output units via a parallel port, a serial port, a keyboard port, a mouse port, and the like to the input/output controller 1020.

A program is provided by computer readable media such as the DVD-ROM 1001 or the IC card. The program is read from the computer readable media, installed into the hard disk drive 1024, RAM 1014, or ROM 1030, which are also examples of computer readable media, and executed by the CPU 1012. The information processing described in these programs is read into the computer 1000, resulting in cooperation between a program and the above-mentioned various types of hardware resources. An apparatus or method may be constituted by realizing the operation or processing of information in accordance with the usage of the computer 1000.

For example, when communication is performed between the computer 1000 and an external device, the CPU 1012 may execute a communication program loaded onto the RAM 1014 to instruct communication processing to the communication interface 1022, based on the processing described in the communication program. The communication interface 1022, under control of the CPU 1012, reads transmission data stored on a transmission buffering region provided in a recording medium such as the RAM 1014, the hard disk drive 1024, the DVD-ROM 1001, or the IC card, and transmits the read transmission data to network 1050 or writes reception data received from network 1050 to a reception buffering region or the like provided on the recording medium.

In addition, the CPU 1012 may cause all or a necessary portion of a file or a database to be read into the RAM 1014, the file or the database having been stored in an external recording medium such as the hard disk drive 1024, the DVD-ROM drive 1026 (DVD-ROM 1001), the IC card, etc., and perform various types of processing on the data on the RAM 1014. The CPU 1012 may then write back the processed data to the external recording medium.

Various types of information, such as various types of programs, data, tables, and databases, may be stored in the recording medium to undergo information processing. The CPU 1012 may perform various types of processing on the data read from the RAM 1014, which includes various types of operations, processing of information, condition judging, conditional branch, unconditional branch, search/replace of information, etc., as described throughout this disclosure and designated by an instruction sequence of programs, and writes the result back to the RAM 1014. In addition, the CPU 1012 may search for information in a file, a database, etc., in the recording medium. For example, when a plurality of entries, each having an attribute value of a first attribute is associated with an attribute value of a second attribute, are stored in the recording medium, the CPU 1012 may search for an entry matching the condition whose attribute value of the first attribute is designated, from among the plurality of entries, and reads the attribute value of the second attribute stored in the entry, thereby obtaining the attribute value of the second attribute associated with the first attribute satisfying the predetermined condition.

The above-explained program or software modules may be stored in the computer readable media on or near the computer 1000. In addition, a recording medium such as a hard disk or a RAM provided in a server system connected to a dedicated communication network or the Internet can be used as the computer readable media, thereby providing the program to the computer 1000 via the network.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a flexible disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to individualize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments of the present invention have been described, the technical scope of the invention is not limited to the above described embodiments. It will be apparent to persons skilled in the art that various alterations and improvements can be added to the above-described embodiments. It should also apparent from the scope of the claims that the embodiments added with such alterations or improvements are within the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
   preparing at least one buffer including a plurality of compression windows, each compression window having a data region for storing data and a statistics region for storing statistics of data stored in the data region;
   receiving a data set;
   writing the received data set into the data region in a first compression window among the plurality of compression windows included in a first buffer among the at least one buffer;
   updating statistics of the statistics region in the first compression window based on the received data set;
   compressing the data set from the data region of the first compression window based on the statistics in the statistics region of the first compression window; and
   sending the compressed data set to the data region of the first compression window to replace the received data set.

2. The computer-implemented method of claim 1, wherein the writing includes, in response to filling the data region of the first compression window, writing remaining data of the received data set into the data region in a second compression window, the second compression window located next to the first compression window.

3. The computer-implemented method of claim 1, wherein
   each compression window further includes a status region for storing a status of each compression window, and
   the writing includes setting the status of the first compression window to "compressible," in response to filling the data region of the first compression window.

4. The computer-implemented method of claim 3, wherein
   the compressing includes compressing the data set in the data region of the first compression window in response to setting the status of the first compression window to "compressible;" and
   the sending includes setting the status of the first compression window to "usable" in response to sending the compressed data set.

5. The computer-implemented method of claim 1, wherein the updating is based on the received data set without referring the data set written in the data region in the first compression window.

6. The computer-implemented method of claim 1, wherein the buffer is a ring buffer configured to use the plurality of compression windows in first-in-first-out (FIFO) order.

7. The computer-implemented method of claim 1, wherein
   the at least one buffer is a plurality of buffers,
   the data set includes a plurality of data segments, and
   the writing includes writing each data segment of the received data set into a corresponding buffer among the plurality of buffers.

8. The computer-implemented method of claim 7, wherein
   the compressing includes compressing each data segment based on statistics of the statistics region of the compression window of the corresponding buffer, and
   the sending includes sending the compressed data segments as individual files to one or more storage devices.

9. The computer-implemented method of claim 1, wherein the data set is received in response to a monitored event in a computer system.

10. The computer-implemented method of claim 9, wherein
    the at least one buffer is a plurality of buffers;
    the receiving includes receiving an event data segment from each processor among a plurality of processors in the computer system;
    the writing includes writing each event data segment into a corresponding buffer among the plurality of buffers.

11. The computer-implemented method of claim 1, further comprising:
    initializing the statistics in the statistics region of the first compression window based on statistics in a statistics region of a third compression window previous to the first compression window.

12. A computer program product including one or more computer readable storage mediums collectively storing program instructions that are executable by a processor or programmable circuitry to cause the processor or programmable circuitry to perform operations comprising:
    preparing at least one buffer including a plurality of compression windows, each compression window having a data region for storing data and a statistics region for storing statistics of data stored in the data region;
    receiving a data set;
    writing the received data set into the data region in a first compression window among the plurality of compression windows included in a first buffer among the at least one buffer;
    updating statistics of the statistics region in the first compression window based on the received data set;
    compressing the data set from the data region of the first compression window based on the statistics in the statistics region of the first compression window; and
    sending the compressed data set to the data region of the first compression window to replace the received data set.

13. The computer program product of claim 12, wherein the writing includes, in response to filling the data region of the first compression window, writing remaining data of the received data set into the data region in a second compression window, the second compression window located next to the first compression window.

14. The computer program product of claim 12, wherein the updating is based on the received data set without referring the data set written in the data region in the first compression window.

15. The computer program product of claim 12, wherein the buffer is a ring buffer configured to use the plurality of compression windows in first-in-first-out (FIFO) order.

16. The computer program product of claim 12, wherein
    the at least one buffer is a plurality of buffers,
    the data set includes a plurality of data segments, and the writing includes writing each data segment of the received data set into a corresponding buffer among the plurality of buffers.

17. A buffering apparatus comprising:

a processor or a programmable circuitry; and one or more computer readable mediums collectively including instructions that, when executed by the processor or the programmable circuitry, cause the processor or the programmable circuitry to:

prepare at least one buffer including a plurality of compression windows, each compression window having a data region for storing data and a statistics region for storing statistics of data stored in the data region, receive a data set, write the received data set into the data region in a first compression window among the plurality of compression windows included in a first buffer among the at least one buffer, update statistics of the statistics region in the first compression window based on the received data set, compress the data set from the data region of the first compression window based on the statistics in the statistics region of the first compression window, and send the compressed data set to the data region of the first compression window to replace the received data set.

18. The buffering apparatus of claim 17, wherein the writing includes, in response to filling the data region of the first compression window, writing remaining data of the received data set into the data region in a second compression window, the second compression window located next to the first compression window.

19. The buffering apparatus of claim 17, wherein the updating is based on the received data set without referring the data set written in the data region in the first compression window.

20. The buffering apparatus of claim 17, wherein the buffer is a ring buffer configured to use the plurality of compression windows in first-in-first-out (FIFO) order.

* * * * *